United States Patent
Jeong et al.

(10) Patent No.: US 8,461,639 B2
(45) Date of Patent: Jun. 11, 2013

(54) NONVOLATILE MEMORY DEVICE

(75) Inventors: Jaehun Jeong, Hwaseong-si (KR); Hansoo Kim, Suwon-si (KR); Jaehoon Jang, Seongnam-si (KR); Sunil Shim, Seoul (KR); Suyoun Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 405 days.

(21) Appl. No.: 12/718,108

(22) Filed: Mar. 5, 2010

(65) Prior Publication Data

US 2010/0224929 A1    Sep. 9, 2010

(30) Foreign Application Priority Data

Mar. 6, 2009    (KR) .................. 10-2009-0019268

(51) Int. Cl.
*H01L 29/788* (2006.01)

(52) U.S. Cl.
USPC ................... 257/316; 257/315; 257/E29.3

(58) Field of Classification Search
USPC ........ 257/314–326, E27.078, E29.3–E29.309
See application file for complete search history.

(56) References Cited

U.S. PATENT DOCUMENTS

| | | | |
|---|---|---|---|
| 4,597,060 A * | 6/1986 | Mitchell et al. | 365/185.16 |
| 8,030,700 B2 * | 10/2011 | Sakamoto | 257/324 |
| 2007/0158736 A1 | 7/2007 | Arai et al. | |
| 2008/0179659 A1 | 7/2008 | Enda et al. | |
| 2009/0230450 A1 * | 9/2009 | Shiino et al. | 257/314 |

FOREIGN PATENT DOCUMENTS

| | | |
|---|---|---|
| JP | 10-093083 | 4/1998 |
| JP | 2007-180389 | 7/2007 |
| JP | 2008-186868 | 8/2008 |
| KR | 1020080070583 A | 7/2008 |

OTHER PUBLICATIONS

Yoshiaki Fukuzumi et al, "Optimal Integration and Characteristics of Vertical Array Devices for Ultra-High Density, Bit-Cost Scalable Flash Memory", 2007 IEEE, p. 449-452.
H.Tanaka et al, "Bit Cost Scalable Technology with Punch and Plug Process for Ultra High Density Flash Memory", 2007 Symposium on VLSI Technology Digest of Technical Papers, p. 14-15.

* cited by examiner

*Primary Examiner* — Matthew Landau
*Assistant Examiner* — Candice Chan
(74) *Attorney, Agent, or Firm* — Myers Bigel Sibley & Sajovec, P.A.

(57) ABSTRACT

A vertical NAND string nonvolatile memory device can include an upper dopant region disposed at an upper portion of an active pattern and can have a lower surface located a level higher than an upper surface of an upper selection gate pattern. A lower dopant region can be disposed at a lower portion of the active pattern and can have an upper surface located at a level lower than a lower surface of a lower selection gate pattern.

20 Claims, 14 Drawing Sheets

NONVOLATILE MEMORY DEVICE

CROSS-REFERENCE TO RELATED APPLICATIONS

This U.S. non-provisional patent application claims priority under 35 U.S.C. §119 of Korean Patent Application 10-2009-0019268, filed on Mar. 6, 2009, the entire contents of which are hereby incorporated by reference.

BACKGROUND

The present disclosure herein relates to a memory device, and more particularly, to a nonvolatile memory device.

For highly integrated semiconductor devices, fine components should be formed and the characteristics of each component should be maintained. The highest-priced equipment can be used to fabricate the finer components. However, there may be limits to the capability of even the highest-priced equipment.

SUMMARY

Embodiments of the inventive concept can provide a nonvolatile memory device comprising: a plurality of cell gate patterns and plurality of inter-gate insulating patterns stacked alternately on a substrate; an upper selection gate pattern disposed on the uppermost inter-gate insulating pattern; a lower selection gate pattern interposed between the lowermost inter-gate insulating pattern and the substrate; an active pattern extending upward along sidewalls the lower selection gate pattern, the cell gate patterns, and the upper selection gate pattern on the substrate; a data storage pattern interposed between the lower selection gate pattern, the cell gate patterns, and the upper selection gate pattern and the active pattern; an upper dopant region disposed at an upper portion of the active pattern and having a lower surface located so as to be higher than an upper surface of the upper selection gate pattern; and a lower dopant region disposed at a lower portion of the active pattern and having an upper surface located so as to be lower than a lower surface of the lower selection gate pattern.

In some embodiments, the nonvolatile memory device may further comprise a bit line electrically connected to the upper dopant region. The bit line may be formed of a substance different from that of the upper dopant region.

In some embodiments, the nonvolatile memory device may further comprise a contact plug between the upper dopant region and the bit line. The contact plug may be formed of a substance different from that of the upper dopant region.

In some embodiments, the nonvolatile memory device may further comprise an ohmic layer between the upper dopant region and the contact plug.

In some embodiments, when an operational voltage is applied to the upper selection gate pattern and the lower selection gate pattern, an inversion layer may be formed on a sidewall of the active pattern between the upper dopant region and the upper selection gate pattern and a sidewall of the active pattern between the lower dopant region and the lower selection gate pattern.

In some embodiments, the active pattern may comprise a first semiconductor pattern, a second semiconductor pattern, and a third semiconductor pattern, which are sequentially stacked. The lower dopant region may be formed at least in the first semiconductor pattern. The upper dopant region may be formed at least in the third semiconductor pattern.

In some embodiments, a boundary surface may exist between the first semiconductor pattern and the second semiconductor pattern and between the second semiconductor pattern and the third semiconductor pattern.

In some embodiments, a distance between the lower surface of the upper dopant region and the upper surface of the upper selection gate pattern may be longer than that between the upper surface of the lower dopant region and the lower surface of the lower selection gate pattern.

In some embodiments, an inter-gate insulating pattern disposed on the uppermost inter-gate insulating pattern of the inter-gate insulating patterns may be thicker than an inter-gate insulating pattern between the cell gate patterns.

In some embodiments, the nonvolatile memory device may further comprise an upper insulating pattern disposed on the upper selection gate pattern. The upper insulating pattern may be thicker than the inter-gate insulating pattern.

In some embodiments, the nonvolatile memory device may further comprise a lower insulating pattern disposed between the lower selection gate pattern and the substrate. The lower insulating pattern may be thicker than the inter-gate insulating pattern.

In some embodiments, a distance between the upper surface of the upper selection gate pattern and the upper dopant region may be shorter than or equal to that between adjacent cell gate patterns.

In some embodiments, a distance between the lower surface of the lower selection gate pattern and the lower dopant region may be shorter than or equal to that between adjacent cell gate patterns.

Embodiments of the inventive concept can provide a vertical NAND string nonvolatile memory device comprising: an upper dopant region disposed at an upper portion of an active pattern and having a lower surface located a level higher than an upper surface of an upper selection gate pattern; and a lower dopant region disposed at a lower portion of the active pattern and having an upper surface located at a level lower than a lower surface of a lower selection gate pattern.

Embodiments of the inventive concept can provide a vertical NAND string nonvolatile memory device comprising: an upper dopant region disposed at an upper portion of an active pattern and having a lower surface facing a vertical channel of the device that is located above an upper surface of an upper selection gate pattern by a first distance selected to increase a threshold voltage of a transistor comprising the upper dopant region and the upper selection gate pattern; and a lower dopant region disposed at a lower portion of the active pattern and having an upper surface facing the vertical channel located beneath a lower surface of a lower selection gate pattern by a second distance selected to increase a threshold voltage of a transistor comprising the lower dopant region and the lower selection gate pattern.

DETAILED DESCRIPTION OF PREFERRED EMBODIMENTS

Figure 1:
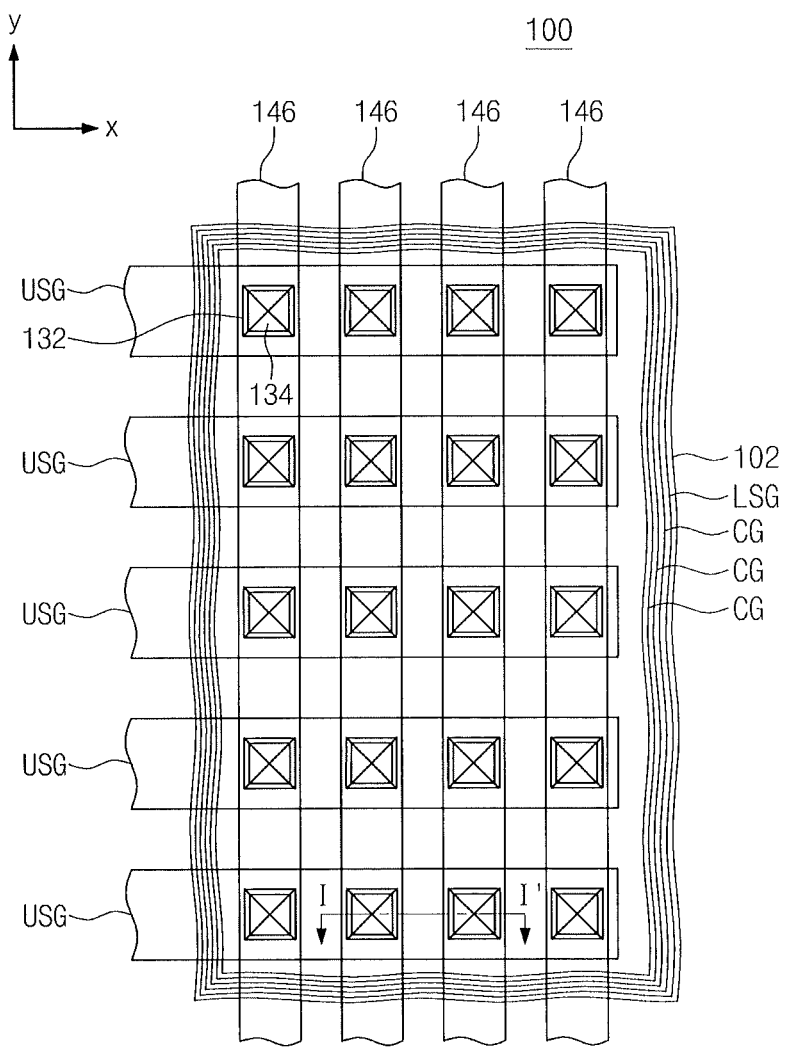
FIG. 1 is a plan view illustrating a nonvolatile memory device according to an exemplary embodiment of the inventive concept.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to comprise deviations in shapes that result, for example, from manufacturing.

Figure 2:
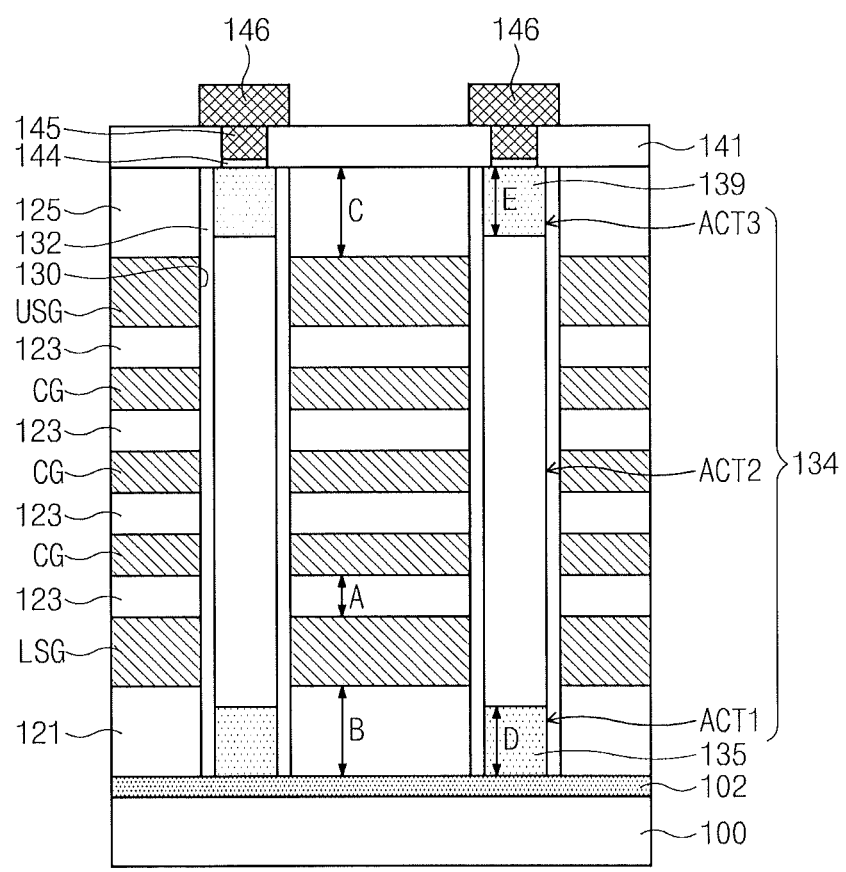
FIG. 2 is a cross-sectional view illustrating the nonvolatile memory device taken along the line I-I' of FIG. 1 according to an exemplary embodiment of the inventive concept.

Referring to FIGS. 1 and 2, a nonvolatile memory device according to an exemplary embodiment of the inventive concept will be described. FIG. 1 is a plan view illustrating the nonvolatile memory device according to an exemplary embodiment of the inventive concept. FIG. 2 is a sectional view illustrating the nonvolatile memory device taken along the line I-I' of FIG. 1 according to an exemplary embodiment of the inventive concept.

Referring to FIGS. 1 and 2, a substrate 100 comprising a cell region is provided. The substrate 100 may be a semiconductor-based semiconductor substrate. The substrate 100 comprises a well region doped with first conductive type dopants. A common source region 102 is disposed within the well region. The common source region 102 is disposed in the upper portion of the substrate 100. The common source region 102 is doped with second conductive type dopants.

A plurality of cell gate patterns CGs and a plurality of inter-gate insulating patterns 123 are alternately stacked on the substrate 100. The plurality of cell gate patterns CGs is stacked on the substrate 100 so that the cell gate patterns CGs are spaced apart from each other by the inter-gate insulating patterns 123. The specific number of the cell gate patterns CGs is illustrated in the drawings, but the number of cell gate patterns CGs is not limited.

The plurality of cell gate patterns CGs is formed in a plate form on the substrate 100. Alternatively, the cell gate patterns CGs may be formed in a line form extending in one direction on the substrate 100. A distance "A" between two vertically adjacent cell gate patterns CGs is determined so that an inversion layer is formed between the cell gate patterns CGs in an operation of a cell string comprising the cell gate patterns CGs. The inversion layer is formed on the sidewall of an active pattern, which will be described below. In an exemplary embodiment of the inventive concept, the distance "A" between the cell gate patterns CGs is substantially the same as the thickness of the inter-gate insulating pattern 123.

A lower selection gate pattern LSG is disposed between the lowermost cell gate pattern of the plurality of cell gate patterns CGs and the substrate 100. The lower selection gate pattern LSG is disposed on the cell region of the substrate 100. The lower selection gate pattern LSG is disposed in a plate form. Alternatively, the lower selection gate pattern LSG may be formed in a line form extending in a first direction on the substrate 100.

A distance "B" between the substrate 100 and the lower selection gate pattern LSG is longer than the distance "A" between the cell gate patterns CGs. The lowermost cell gate pattern CG and the lower selection gate pattern LSG is spaced apart from each other by the inter-gate insulating pattern 123.

A lower insulating pattern 121 is formed between the lower selection gate pattern LSG and the substrate 100. In an exemplary embodiment of the inventive concept, the thickness of the lower insulating pattern 121 is substantially the same as the distance "B" between the substrate 100 and the lower selection gate pattern LSG.

An upper selection gate pattern USG is disposed on the uppermost cell gate pattern of the plurality of cell gate patterns CGs. The upper selection gate pattern USG is disposed in a line form extending in the first direction. The first direction corresponds to an x-axis direction. A distance "C" between the lower surface of the upper selection gate pattern USG and the upper surface of the active pattern, which will be described below, is longer than the distance "A" between the cell gate patterns CGs. Here, the distance "C" between the lower surface of the upper selection gate pattern USG and the upper surface of the active pattern is defined as the shortest distance between a plane extending from the upper selection gate pattern USG and a plane extending from the upper surface of the active pattern.

The inter-gate insulating pattern 123 may further be interposed between the uppermost cell gate pattern and the upper selection gate pattern USG. In an exemplary embodiment of the inventive concept, the thickness of an upper insulating pattern 125 is substantially the same as the distance "C" between the lower surface of the upper selection gate pattern USG and the upper surface of the active pattern.

The sidewalls of the gate patterns LSG, CG, and USG and the insulating patterns 121, 123, and 125 are co-planar. In an exemplary embodiment of the inventive concept, a surface formed by the sidewalls of the gate patterns LSG, CG, and USG and the insulating patterns 121, 123, and 125 may not be perpendicular to the upper surface of the substrate 100. That is, an angle formed by the surface of the sidewalls of the gate patterns LSG, CG, and USG and the insulating patterns 121, 123, and 125 and a normal line of the upper surface of the substrate 100 may be larger than 0°. In this case, the lower surfaces and the side surfaces of the gate patterns LSG, CG, and USG may form an acute angle. Moreover, the lower surfaces and the side surfaces of the insulating patterns 121, 123, and 125 may form an acute angle.

An opening 130 penetrating the gate patterns LSG, CG, and USG is defined on the substrate 100. The opening 130 comprises the bottom defined by the common source region 102 and the sidewalls defined by the sidewalls of the gate patterns LSG, CG, and USG and the insulating patterns 121, 123, and 125. In an exemplary embodiment of the inventive concept, the opening 130 may have a sidewall which is not perpendicular to the upper surface of the substrate 100. The opening 130 may be a hole penetrating the gate patterns LSG, CG, and USG and the insulating patterns 121, 123, and 125. The cross section of the opening 130 taken in parallel to the substrate 100 may be formed in a polygonal shape or a circular shape. Alternatively, the opening 130 may be formed in a groove shape extending in the first direction of the substrate 100.

An active pattern 134 is formed in the opening 130. The opening 130 may be filled with the active pattern 134. Alternatively, the active pattern 134 may be formed in a hollow columnar shape. In this case, an empty space surrounded by the active pattern 134 may be filled with an insulating layer. The active pattern 134 is adjacent to the common source region 102. The active pattern 134 extends upward along the sidewalls of the gate patterns LSG, CG, and USG and the insulating patterns 121, 123, and 125, to provide the basis for the formation of vertical NAND string channels of the non-volatile memory device.

In an exemplary embodiment of the inventive concept, the active pattern 134 may have an upper portion and a lower portion with different widths. For example, the area of the upper portion of the active pattern 134 may be broader than the area of the lower portion of the active pattern 134. That is, the width of the active pattern 134 is the narrowest in the portion adjacent to the substrate 100 and becomes broader in the portion as distant from the substrate 100. The sidewall of the active pattern 134 may not be perpendicular to the upper surface of the substrate 100. That is, one surface forming the sidewall of the active pattern 134 may be oblique from the normal line of the upper surface of the substrate 100.

The active pattern 134 contains a semiconductor material. For example, the active pattern 134 contains a single crystal semiconductor substance, a polycrystalline semiconductor substance, or an amorphous semiconductor substance. The active pattern 134 is doped with dopants. For example, the active pattern 134 is doped with the first conductive-type dopants or the second conductive-type dopants. Alternatively, the active pattern 134 may be formed of a semiconductor substance which is not doped with dopants.

The active pattern 134 comprises a first semiconductor pattern ACT1, a second semiconductor pattern ACT2, and a third semiconductor pattern ACT3 which are sequentially stacked from the substrate 100. Boundary surfaces may exist between the first semiconductor pattern ACT1 and the second semiconductor pattern ACT2 and/or between the second semiconductor pattern ACT2 and the third semiconductor pattern ACT3. Alternatively, no boundary surface exist between the first semiconductor pattern ACT1 and the second semiconductor pattern ACT2 and between the second semiconductor pattern ACT2 and the third semiconductor pattern ACT3.

A lower dopant region 135 is disposed at the lower portion of the active pattern 134. The lower dopant region 135 is disposed at least within the first semiconductor pattern ACT1. That is, the dopants of the lower dopant region 135 may exist only in the first semiconductor pattern ACT1 or may expand to the first semiconductor pattern ACT 1 and the second semiconductor pattern ACT2. In the specification and the drawings, the case where the lower dopant region 135 exists in the semiconductor pattern ACT1 will be described for convenience of description.

The upper surface of the lower dopant region 135 is located so as to be lower than the lower surface of the lower selection gate pattern LSG. A thickness D of the lower dopant region 135 is smaller than the distance "B" between the lower surface of the lower selection gate pattern LSG and the substrate 100. The lower dopant region 135 does not overlap with the lower selection gate pattern LSG. A distance between the lower dopant region 135 and the lower selection gate pattern LSG is defined as the shortest distance between a plane extending from the upper surface of the lower dopant region 135 and a plane extending from the lower surface of the lower selection gate pattern LSG. A threshold voltage value of a selection transistor comprising the lower dopant region and the lower selection gate pattern can be controlled in accordance with a distance "B-D" of the lower dopant region 135 and the lower selection gate pattern LSG. For example, as the distance of the lower dopant region 135 and the lower selection gate pattern LSG is longer, the threshold voltage value of the selection gate pattern may increase.

The distance of the lower dopant region 135 and the lower selection gate pattern LSG is adjusted within the range of forming an inversion layer. Then, when an operational voltage is applied to the lower selection gate pattern LSG, the inversion layer is formed on the sidewall of the active pattern 134 between the lower dopant region 135 and the lower selection gate pattern LSG.

An upper dopant region 139 is disposed at the upper portion of the active pattern 134. The upper dopant region 139 may be disposed at least within the third semiconductor pattern ACT3. The third semiconductor pattern ACT3 doped with dopants may be at least part of the upper dopant region 139. That is, the dopants of the upper dopant region 139 may exist only in the third semiconductor pattern ACT3 or may exist in the semiconductor pattern ACT3 and the upper portion of the second semiconductor pattern ACT2. In the following specification and the drawings, the case where the upper dopant region 139 exists in the third semiconductor pattern ACT3 will be described for convenience of description.

The lower surface of the upper dopant region 139 is located so as to be higher than the upper surface of the upper selection gate pattern USG. In an exemplary embodiment of the inventive concept, a thickness E of the upper dopant region 139 is smaller than the distance "C" between the upper selection gate pattern USG and the upper surface of the active pattern 134. Therefore, the upper dopant region 139 does not overlap with the upper selection gate pattern USG. A distance "C-E" between the upper dopant region 139 and the upper selection gate pattern USG is defined as the shortest distance between a plane extending from the lower surface of the upper dopant region 139 and a plane extending from the upper surface of the upper selection gate pattern USG. A threshold voltage value of a transistor comprising the upper dopant region and the upper selection gate pattern can be controlled in accordance with the distance between the upper dopant region 139 and the upper selection gate pattern USG. In an exemplary embodiment of the inventive concept, it is possible to improve the threshold voltage value of the transistor comprising the upper dopant region 139 and the upper selection gate pattern USG by increasing the distance between the upper dopant region 139 and the upper selection gate pattern USG.

The distance between the upper dopant region 139 and the upper selection gate pattern USG is adjusted in the range forming the inversion layer. Then, when an operational voltage is applied to the upper selection gate pattern USG, the inversion layer may be formed on the sidewall of the active pattern 134 between the upper dopant region 139 and the upper selection gate pattern USG.

The nonvolatile memory device according to the exemplary embodiments of the inventive concept provides the selection transistor having the sufficient threshold voltage value by adjusting the distance between the dopant region and the selection gate pattern. Since the selection transistor of each cell string has the sufficient threshold voltage value, like the embodiments of the inventive concept, the reliability of the memory device can be improved. For example, since a charge retention force of the selection transistor is improved, and the reliability of the memory device can be improved.

Figure 4:
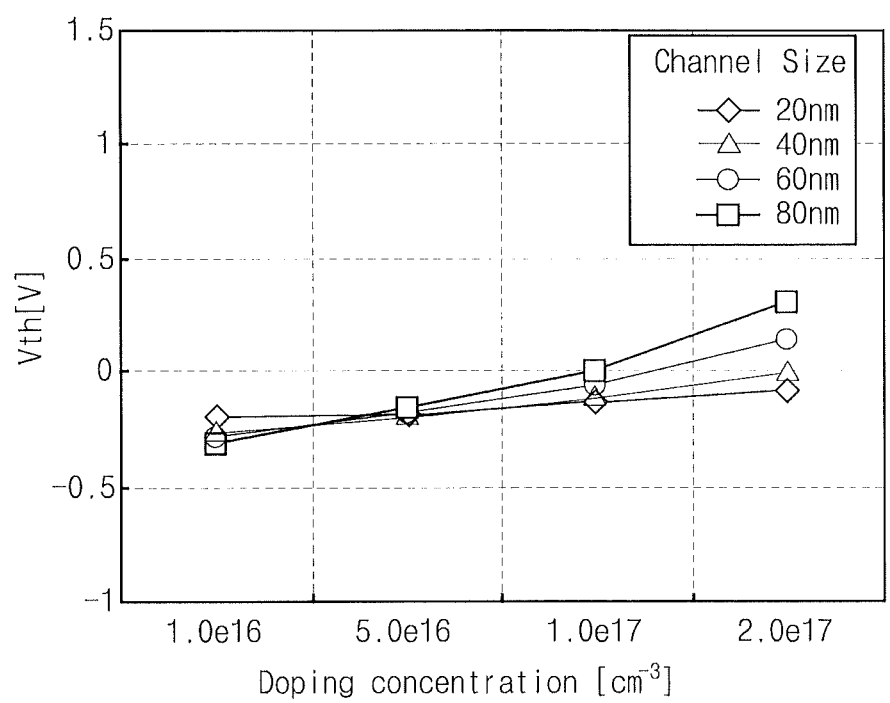
FIGS. 4 and 5 are diagrams illustrating characteristics according to exemplary embodiments of the inventive concept.

In the memory device comprising the selection transistor having no sufficient threshold voltage value, the reliability may deteriorate. In particular, the width of the active pattern may become narrower in accordance with the high integration of the device. It may be further difficult to control the threshold voltage value of the selection transistor comprising the active pattern with the narrow width at a certain level. As a way of increasing the threshold voltage value of the selection transistor, a doping concentration of the dopant regions formed in the upper and lower portions of the active pattern can be adjusted. Referring to FIG. 4, however, the threshold voltage value may not be easily controlled by this way. FIG. 4 illustrates a variation in the threshold voltage values (y-axis) of the selection transistor in accordance with the doping concentration (x-axis) of the dopant region. Moreover, as the width of the active pattern becomes narrower, the threshold voltage value is not so increased in accordance with an increase in the doping concentration in spite of the high doping concentration of the dopant regions. That is, as the width of the active pattern becomes much narrower in accordance with the high integration of the device, it may be further difficult to ensure the threshold voltage value of the selection transistor.

In the nonvolatile memory device according to the exemplary embodiments of the invention of the inventive concept, however, it is possible to easily adjust the threshold voltage value of the selection transistors at an appropriate level by adjusting the spaced distances between the selection gate patterns LSG and USG and the dopant regions 135 and 139, respectively. For example, by appropriately spacing the selection gate pattern and the dopant region, it is possible to embody the selection transistor having a high threshold voltage value.

Figure 5:
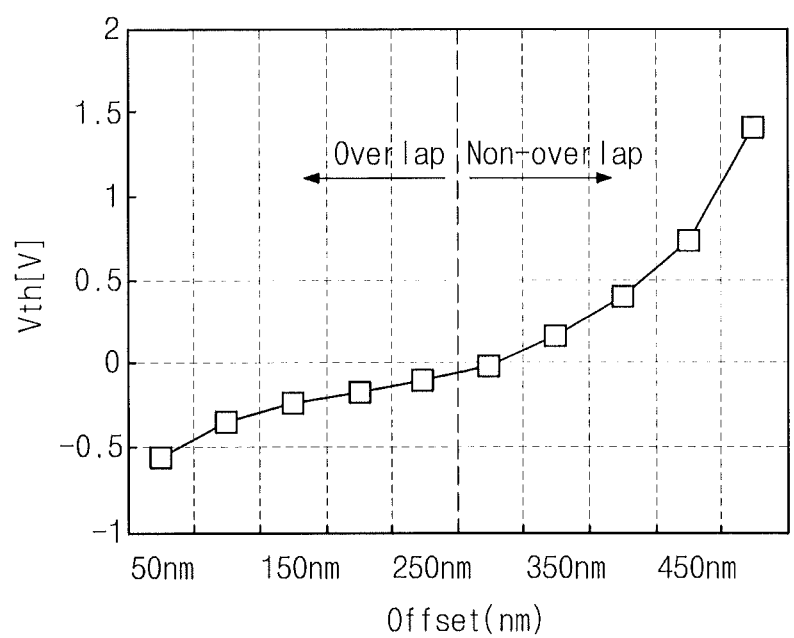

FIG. 5 illustrates threshold voltage value determined in accordance with the spaced distance between the selection gate pattern and the dopant region. In FIG. 5, the x-axis represents the distance between the upper surface of the active pattern and the upper surface of the upper selection gate pattern. The y-axis represents the threshold voltage value determined in accordance with the distance between the upper surface of the active pattern and the upper surface of the upper selection gate pattern. In the upper portion of the active pattern, the dopant region is formed so as to have thickness E of about 250 nm. That is, when the value of x-axis is 250 nm or more, there is no area where the upper dopant region formed at the upper portion of the active pattern and the upper selection gate pattern overlap with each other. In the exemplary embodiments of the inventive concept, when a distance "C-E" between the upper dopant region and the selection gate pattern is larger than 0, it can be known with reference to the graph that the threshold voltage value of the transistor comprising the dopant region and the selection gate pattern is increased. This result can analogically be applied to a case where the lower selection gate pattern and the lower dopant region are spaced apart from each other.

In an exemplary embodiment of the inventive concept, the distance between the upper selection gate pattern USG and the upper dopant region 139 may be longer than the distance between the lower selection gate pattern LSG and the lower dopant region 135. In an exemplary embodiment of the inventive concept, it is possible to obtain the desired threshold voltage values of the upper and lower selection transistors by adjusting the distances between the selection gate patterns LSG and USG and the dopant regions 135 and 139, respectively. In the operation of the cell string, a larger operational voltage value can be applied to the upper selection transistor. In order to prevent the leakage current of the upper selection transistor, therefore, the threshold voltage value of the upper selection transistor is required to be larger than that of the lower selection transistor. In this embodiment of the inventive concept, it is possible to further increase the threshold voltage value of the upper selection transistor by permitting the distance "C-E" between the upper selection gate pattern USG and the upper dopant region 139 to be longer than the distance "B-D" between the lower selection gate pattern LSG and the lower dopant region 135. Alternatively, it is possible to obtain different threshold voltage values by adjusting the distances between the selection gate patterns LSG and USG and the dopant regions 135 and 139, respectively.

A bit line 146 is disposed on the upper dopant region 139. The bit line 146 extends in a second direction intersecting the upper selection gate pattern USG. The second direction corresponds to the y-axis direction.

The bit line 146 is electrically connected to the upper dopant region 139. The upper dopant region 139 is electrically connected to the bit line 146 and a contact plug 146. An ohmic layer 144 is interposed between the upper dopant region 139 and the contact plug 146.

The bit line 146 is formed of a substance different from that of the upper dopant region 139. The bit line 146 is fowled of a substance different from that of the third semiconductor pattern ACT3. For example, the third semiconductor pattern ACT3 may be formed of a doped semiconductor substance, and the bit line 146 may be formed of metal or a metal compound. In this case, the ohmic layer 144 may be formed of a compound of a metal element and a semiconductor element. For example, the ohmic layer 144 is formed of metal silicide.

A data storage pattern 132 is interposed between the gate patterns LSG, CG, and USG and the active pattern 134. The data storage pattern 132 covers the sidewall of the opening 130.

The data storage pattern 132 comprises a plurality of layers. The data storage pattern 132 may comprise a tunnel barrier adjacent to the active pattern 134, a blocking insulating pattern adjacent to the gate patterns LSG, CG, and USG, and a charge storage pattern formed between the tunnel barrier and the blocking insulating pattern. Unlike the drawing, when the gate patterns LSG, CG, and USG are disposed in a line form, the data storage pattern 132 may extend in the upper and lower surfaces of the gate patterns LSG, CG, and USG.

Hereinafter, a method of forming the nonvolatile memory device according to an exemplary embodiment of the inventive concept will be described with reference to FIGS. 1, 2, and FIGS. 3A to 3H. The details described above with reference to FIGS. 1 and 2 may partially be omitted.

Figure 3A:
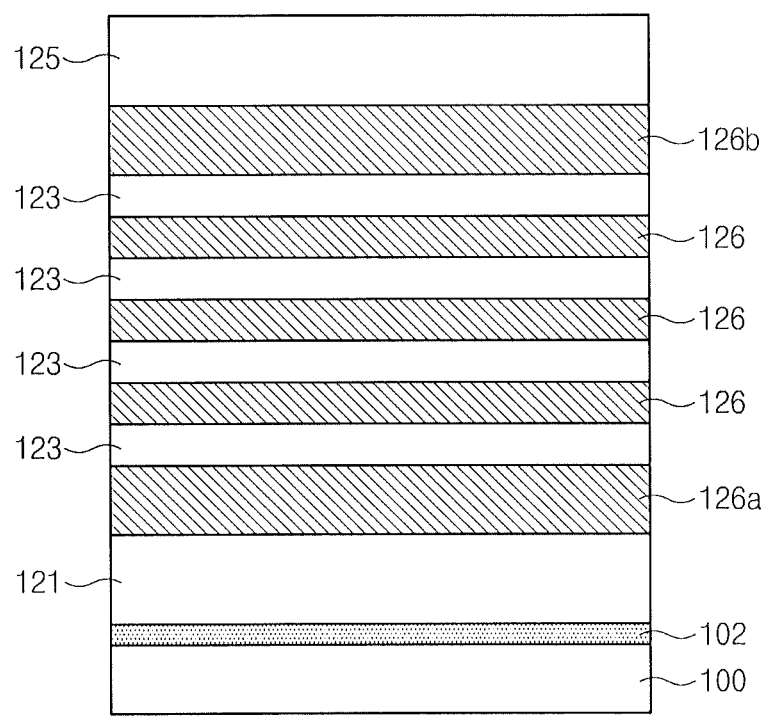
FIGS. 3A through 3H are cross-sectional diagrams illustrating methods of forming nonvolatile memory devices according to exemplary embodiments of the inventive concept.

Referring to FIG. 3A, the substrate 100 comprising the common source region 102 is prepared. The substrate 100 comprises the well region doped with the dopants, and the common source region 102 is formed in the well region. In an exemplary embodiment of the inventive concept, the well region contains the first conductive-type dopants, and the common source region 102 contains the second conductive-type dopants.

The insulating patterns 121, 123, and 125 and gate layers 126a, 126, and 126b are alternately stacked on the substrate 100. The insulating patterns 121, 123, and 125 contain at least one substance selected from insulating substances comprising oxide and nitride. The gate layers 126a, 126, and 126b contain at least one substance selected from conductive substances comprising a doped semiconductor, metal, and a metal compound.

Among the gate layers 126a, 126, and 126b, the gate layer 126a adjacent to the common source region 102 is a lower selection gate layer 126a. The uppermost gate layer 126b of the gate layers 126a, 126, and 126b is an upper selection gate layer 126b. The gate layers 126 formed between the lower selection gate layer 126a and the upper selection gate layer 126b are cell gate layers 126. The selection gate layers 126a and 126b are formed so as to be thicker than the cell gate layers 126.

Among the insulating patterns 121, 123, and 125, the insulating pattern 121 between the lower selection gate pattern LSG and the substrate 100 is called the lower insulating pattern 121, and the insulating pattern 125 on the upper selection gate pattern USG is called the upper insulating pattern 125. The insulating pattern 123 between the upper insulating pattern 125 and the lower insulating pattern 121 is the inter-gate insulating pattern 123.

The lower and upper insulating patterns 121 and 125 are each formed so as to have a thickness different from that of the inter-gate insulating pattern 123. For example, the thickness of the inter-gate insulating patterns 123 is smaller than the thicknesses of the lower and upper insulting patterns 121 and 125. In an exemplary embodiment of the inventive concept, when an upper dopant region, which will be described below, is formed by an ion implantation process, the thickness of the upper insulating pattern 125 is determined in consideration of an implantation depth and a diffusion depth of dopants upon ion-implanting the dopants. Alternatively, when the upper dopant region is formed in accordance with another way, the thickness of the upper insulating pattern 125 may be equal to that of the inter-gate insulating pattern 123.

Figure 3B:
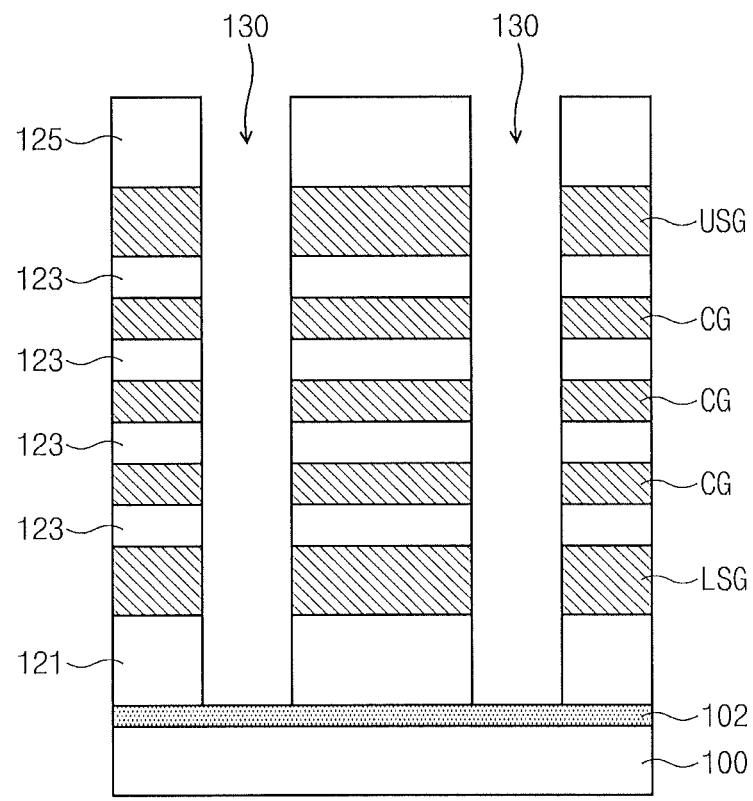

Referring to FIG. 3B, the gate patterns LSG, CG, and USG are formed by patterning the gate layers 126a, 126, and 126b. When the gate layers 126a, 126, and 126b are patterned, the insulating patterns 121, 123, and 125 are patterned together. Among the gate patterns LSG, CG, and USG, the gate pattern LSG adjacent to the substrate 100 is the lower selection gate pattern LSG. The uppermost gate pattern USG of the gate patterns LSG, CG, and USG is the upper selection gate pattern USG. The upper selection gate pattern USG is additionally patterned in the subsequent process. Accordingly, the upper selection gate pattern USG may be provided in a line form. The gate patterns CGs between the upper selection gate pattern USG and the lower selection gate pattern LSG may be the cell gate patterns CGs.

The opening 130 may be defined by the sidewalls of the gate patterns LSG, CG, and USG, the sidewalls of the insulating patterns 121, 123, and 125, and the upper surface of the exposed substrate 100. Specifically, the sidewall of the opening 130 is defined by the sidewalls of the gate patterns LSG, CG, and USG and the sidewalls of the insulating patterns 121, 123, and 125, and the bottom of the opening 130 is defined by the upper surface of the exposed substrate 100.

The sidewall of the opening 130 may not be perpendicular to the upper surface of the substrate 100. The sidewall of the opening 130 may be inclined at an angle larger than 0° with respect to the normal line of the upper surface of the substrate 100. The sidewall of the opening 130 may be inclined at a large angle with respect to the normal line of the upper surface of the substrate 100 as the sum of the thicknesses of the layers stacked on the substrate 100 is increased. Alternatively, the sidewall of the opening 130 may be perpendicular to the upper surface of the substrate 100.

Figure 3C:
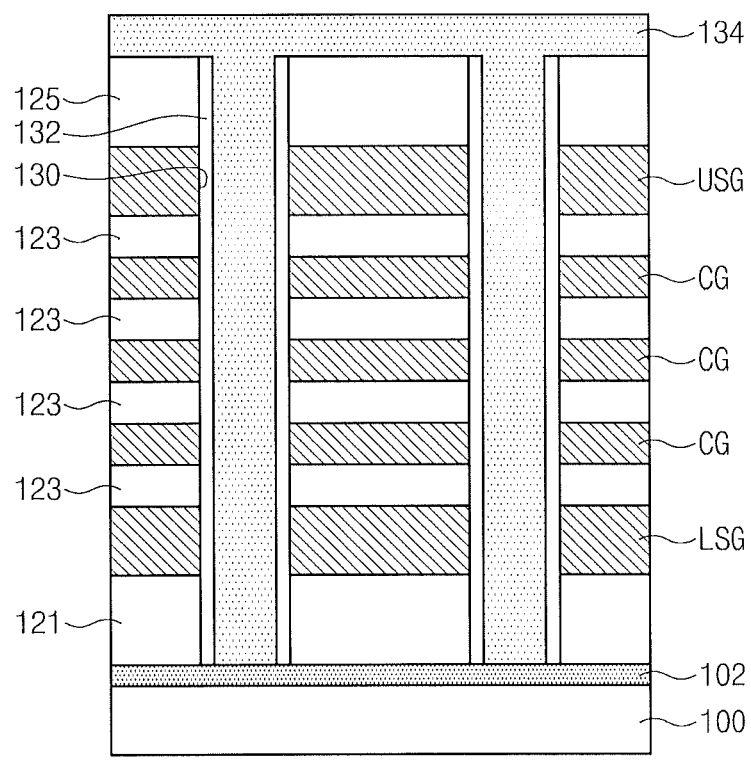

Referring to FIG. 3C, the data storage pattern 132 is formed on the sidewall of the opening 130. The data storage pattern 132 is formed by forming a data storage layer covering the sidewall and the bottom of the opening 130 and then removing the data storage layer formed on the bottom of the opening 130.

The data storage pattern 132 comprises the blocking insulating pattern adjacent to the sidewalls of the gate patterns LSG, CG, and USG and the sidewalls of the insulating patterns 121, 123, and 125, the charge storage pattern formed on the blocking insulating pattern, and the tunnel insulating pattern formed on the charge storage pattern.

A first semiconductor layer 134 is formed in the opening 130. The opening 130 is filled with the first semiconductor layer 134. The first semiconductor layer 134 contains a semiconductor substance doped with dopants. The first semiconductor layer 134 contains a single-crystal semiconductor substance or a polycrystalline semiconductor substance. The first semiconductor layer 134 is formed by a layer forming process comprising a chemical vapor deposition. When the first semiconductor layer 134 is formed by a deposition process, the dopants are doped in the first semiconductor layer 134 by an in-situ process.

Figure 3D:
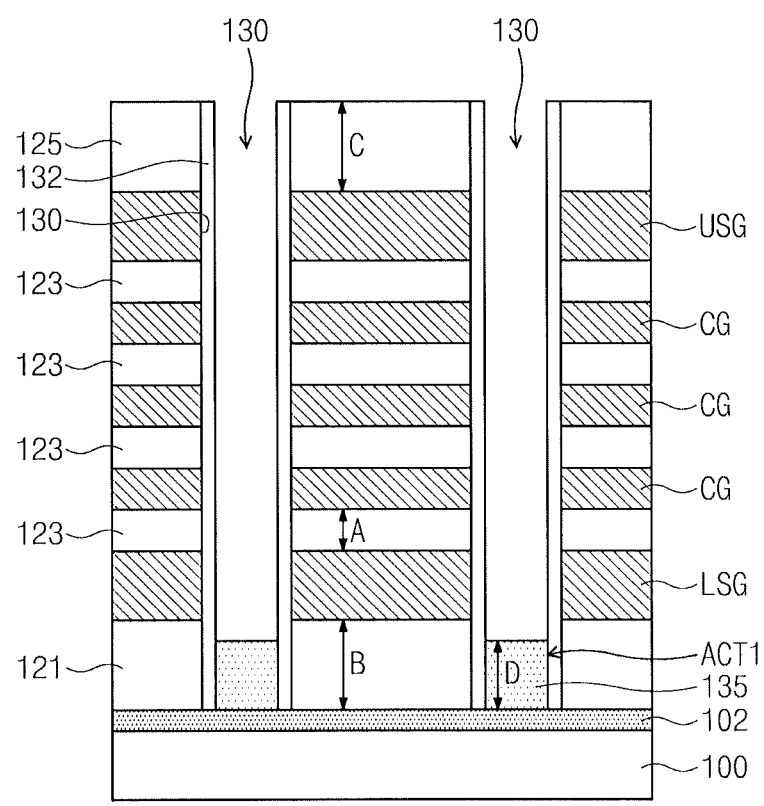

Referring to FIG. 3D, the first semiconductor pattern ACT1 is formed by etching the first semiconductor layer 134. The first semiconductor layer 134 is etched by an etch-back process. The first semiconductor layer 134 is etched until the upper surface of the first semiconductor layer 134 becomes lower than the lower surface of the lower selection gate pattern LSG. That is, the upper surface of the first semiconductor pattern ACT1 is located below the lower surface of the lower selection gate pattern LSG. The first semiconductor pattern ACT1 comprises the lower dopant region 135. At least part of the lower dopant region 135 is disposed in the first semiconductor pattern ACT1. Unlike the drawing, the lower dopant region 135 may extend to the inside of the second semiconductor pattern ACT2, which will be described below, by a subsequent process.

Alternatively, the lower dopant region 135 may be formed by other ways. For example, the lower dopant region 135 may be formed by forming a semiconductor pattern at the lower portion of the opening 130 and then implanting dopants into the semiconductor pattern. The dopants may be implanted by an ion implantation process.

Figure 3E:
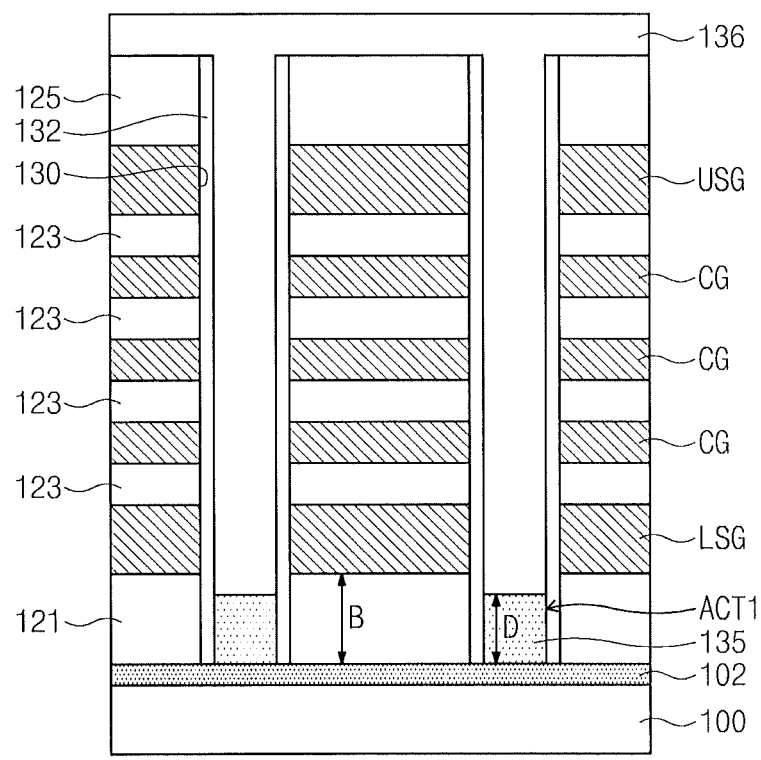

Referring to FIG. 3E, the second semiconductor layer 136 is formed on the first semiconductor pattern ACT 1. The opening 130 is filled with the second semiconductor layer 136. The second semiconductor layer 136 contains a semiconductor substance doped with dopants. The second semiconductor layer 136 is formed by at least one process selected from layer forming processes comprising a deposition process and an epitaxial growth process.

Figure 3F:
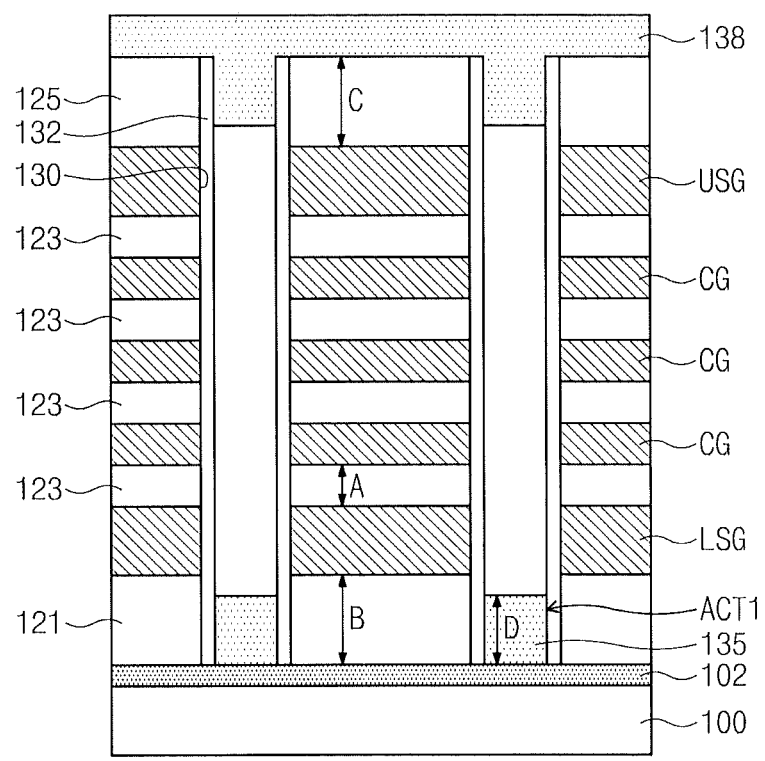

Referring to FIG. 3F, the second semiconductor pattern ACT2 is formed by removing a part of the second semiconductor layer 136. The second semiconductor layer 136 is etched so that the data storage pattern 132 next to the upper surface of the upper selection gate pattern USG is not exposed. In this way, the upper surface of the semiconductor pattern ACT2 is located above the upper surface of the upper selection gate pattern 139. Alternatively, the second semiconductor layer 136 may be removed just until the upper surface of the second semiconductor layer 136 forms the co-plane with the upper surface of the upper insulating pattern 125.

A third semiconductor layer 138 is formed on the second semiconductor pattern ACT2. The third semiconductor layer 138 fills an empty space in the opening 130 formed by removing the second semiconductor layer 136. The lower surface of the third semiconductor layer 138 is disposed above the upper surface of the upper selection gate pattern USG. The third semiconductor layer 138 contains a semiconductor substance doped with dopants. The third semiconductor layer 138 is formed by at least one process selected from layer forming processes comprising a chemical vapor deposition process and an epitaxial growth process. The dopants in the third semiconductor layer 138 are doped in the third semiconductor layer 138 by executing an in-situ process when the third semiconductor layer 138 is formed. Alternatively, after the second semiconductor pattern ACT2 is formed so as to completely fill the opening 130, the third semiconductor layer 138 may be formed by doping the upper portion of the second semiconductor pattern ACT2 with dopants. In this case, the upper insulating pattern 125 is thickly-formed so that numerous dopants in the second semiconductor pattern ACT2 do not reach a region located below the upper surface of the upper selection gate pattern LSG. Therefore, the upper insulating pattern 125 is formed so as to have a thickness larger than ion-implantation and diffusion distance of the dopants.

Figure 3G:
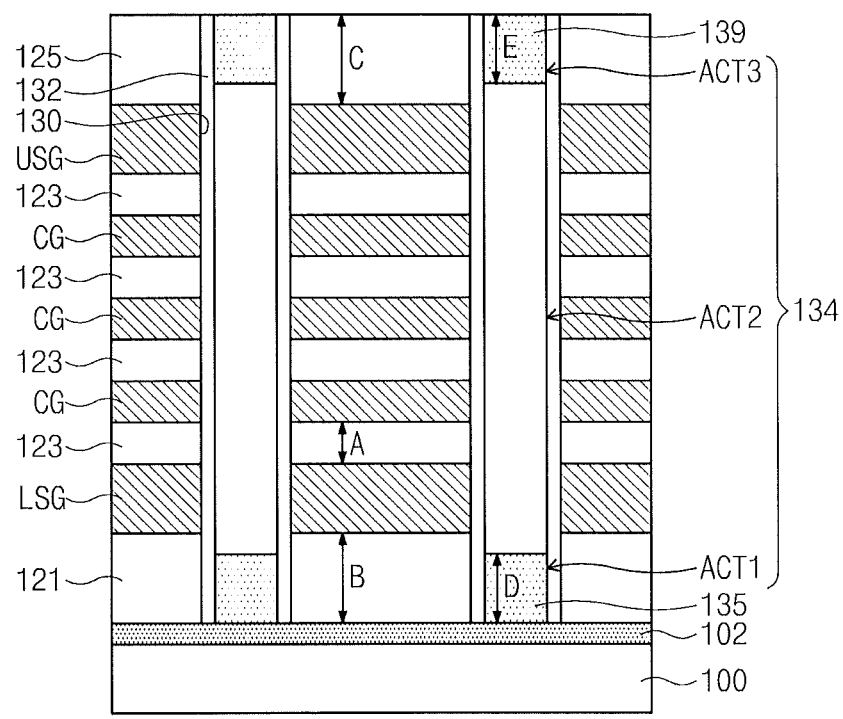

Referring to FIG. 3G, the upper surface of the third semiconductor layer 138 is flattened to form the third semiconductor pattern ACT3. The third semiconductor pattern ACT3 comprises the upper dopant region 139. At least part of the upper dopant region 139 is disposed in the third semiconductor pattern ACT3. The upper dopant region 139 extends to the inside of the second semiconductor pattern ACT2 by a subsequent process.

The first, second, and third semiconductor patterns ACT1, ACT2, and ACT3 may constitute one active pattern 134. In an exemplary embodiment of the inventive concept, the width of the upper surface of the active pattern 134 is different from the width of the lower surface thereof. For example, the circumference of the active pattern 134 becomes larger vertically from the substrate 110. This reason is because the sidewall of the above-described opening 130 is not perpendicular to the upper surface of the substrate 100.

Figure 3H:
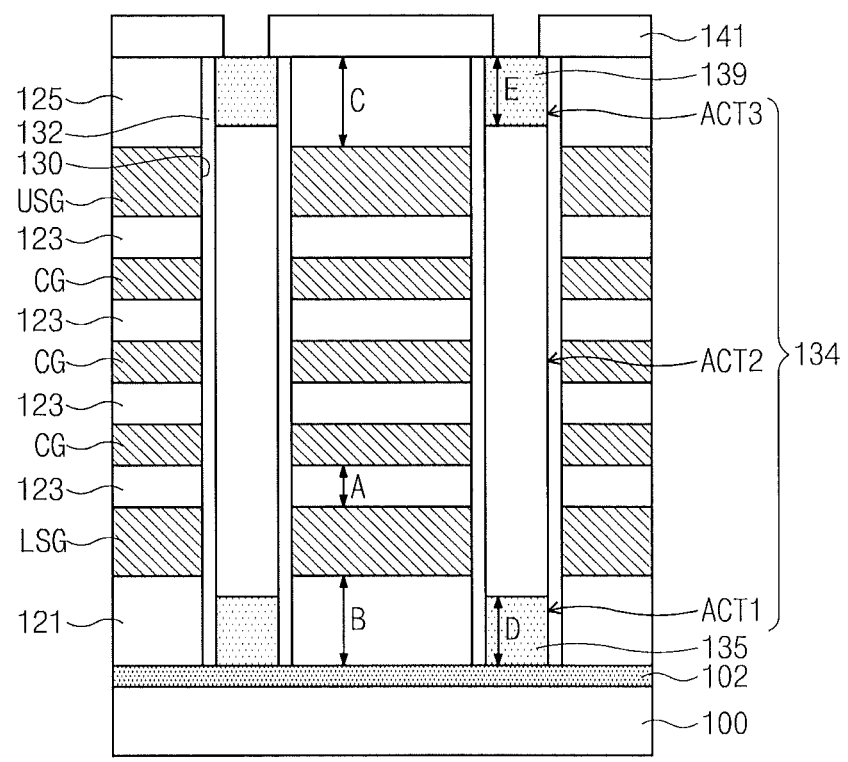

Referring to FIG. 3H, an interlayer insulating layer 141 is formed on the active pattern 134. A hole is formed in the interlayer insulating layer 141 to form a contact plug. The hole exposes the upper surface of the active pattern 134.

Referring again to FIG. 2, the ohmic layer 144 is formed on the active pattern 134 in the hole. The ohmic layer 144 is formed by executing silicidation on the exposed upper surface of the active pattern 134. Accordingly, the ohmic layer 144 contains a semiconductor substance and metal. The ohmic layer 144 is formed of metal silicide.

A contact plug 145 is formed on the ohmic layer 144. The contact plug 145 contains the same metal as the ohmic layer 144. The contact plug 145 may fill the hole in which the ohmic layer 144 is formed.

The bit line 146 may be formed on the interlayer insulating layer 141. The bit line 146 is formed of metal. The bit line 146 may extend to intersect with a direction in which the upper selection gate pattern USG extends. The bit line 146 and the contact plug 145 may be formed by the same process or separate processes.

Figure 6:
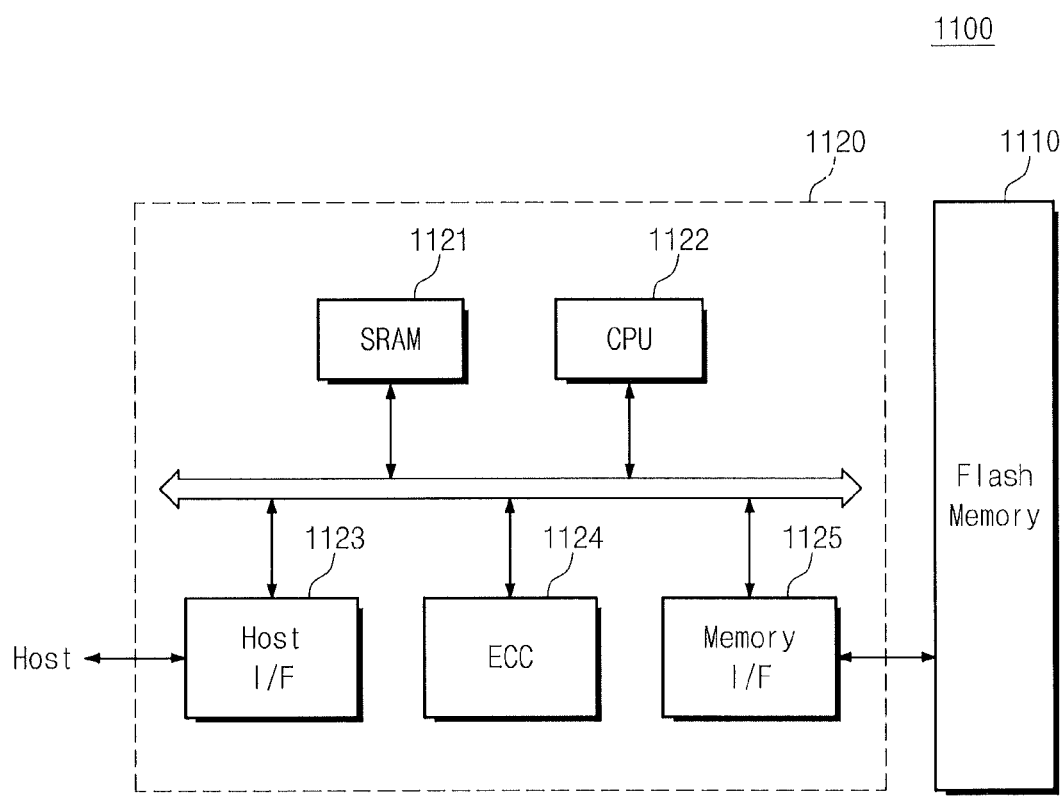
FIGS. 6 and 7 are diagrams illustrating apparatuses and systems according to exemplary embodiments of the inventive concept.

With reference to FIG. 6, an applicable example according to the embodiments of the inventive concept will be described. In this applicable example, the nonvolatile memory device may be applicable to a flash memory 1110. The nonvolatile memory device according to the embodiment of the inventive concept is mounted in a memory card 1100 to support data storage capability of high capacity. The memory card 1100 may comprise a memory controller 1120 for controlling data exchange as a whole between a host and the flash memory 1110.

The memory controller 1120 may comprise a central processing unit 1122, an SRAM 1121, an error correction code 1124, a host interface 1123, and a memory interface 1125. The SRAM 1121 may be used as an operation memory of the central processing unit 1122. The host interface 1123 may have a data exchanging protocol of the host connected to the memory card 1100. The error correction code 1124 may detect and correct errors in the data read from the flash memory 1110. The memory interface 1125 may interface with the flash memory 1110. The central processing unit 1222 may execute various control operations for data exchange of the memory controller 1120. The memory card 1100 may provide a system having high reliability due to improved reliability of the flash memory 1110 according to the embodiment of the invention.

Figure 7:
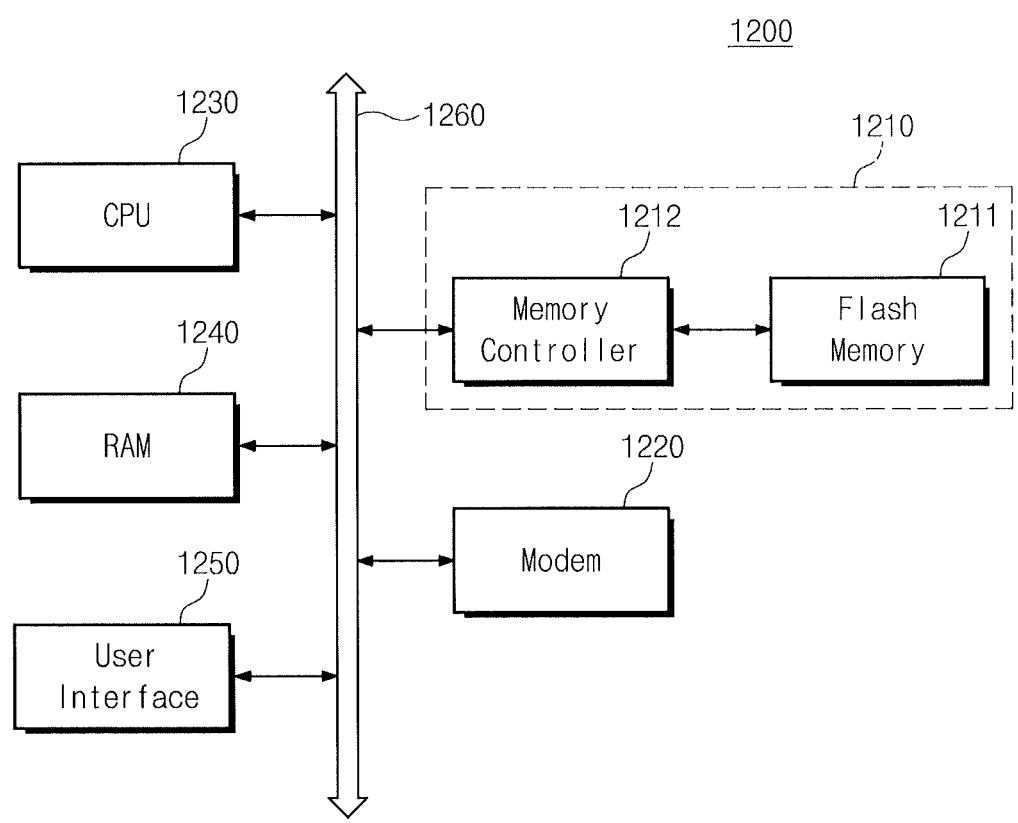

FIG. 7 is a view explaining another applicable example of the nonvolatile memory device according to the embodiments of the inventive concept. FIG. 7 is a block diagram illustrating an information processing system 1200 comprising a memory system 1210. The memory system 1210 may comprise the nonvolatile memory device according to the embodiments of the inventive concept. The memory system 1210 according to the embodiments of the inventive concept may be mounted in the information processing system such as mobile devices or desktop computers. The information processing system 1200 may comprise a memory system 1210, a modem 1220, a central processing unit 1230, RAM 1240, and a user interface 1250, which are electrically connected to the memory system 1210 through a system bus 1260. The memory system 1210 may store data processed by the central processing unit 1230 or data input from the outside. In this applicable example, the memory system 1210 may be configured as a solid state disk (SSD). In this case, the information processing system 1200 may stably store a mass data in the memory system 1210. Moreover, the memory system 1210 can reduce resources required for the error correction, thereby providing a data exchanging function of high speed for the information processing system 1200.

In addition, the nonvolatile memory device according to the embodiments of the inventive concept may be embodied in various types of packages. For example, the nonvolatile memory device may be packaged and mounted in such manners as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

According to the embodiments of the inventive concept, the selection gate patterns and the dopant regions may be formed so as to be spaced apart from one another. This increases the threshold voltage of the selection transistor comprising the selection gate patterns and the dopant regions. Accordingly, the reliability of the memory device comprising the selection transistor may be improved.

The above-disclosed subject matter is to be considered illustrative and not restrictive, and the appended claims are intended to cover all such modifications, enhancements, and other embodiments, which fall within the true spirit and scope of the inventive concept is to be determined by the broadest permissible interpretation of the following claims and their equivalents, and shall not be restricted or limited by the foregoing detailed description.

What is claimed is:

1. A nonvolatile memory device comprising:
   a plurality of cell gate patterns and plurality of inter-gate insulating patterns stacked alternately on a substrate;
   an upper selection gate pattern disposed on an uppermost of the inter-gate insulating patterns;
   a lower selection gate pattern between a lowermost of the inter-gate insulating patterns and the substrate;
   an active pattern extending upward along sidewalls of the lower selection gate pattern, the cell gate patterns, and the upper selection gate pattern on the substrate;
   a data storage pattern between the lower selection gate pattern, the cell gate patterns, and the upper selection gate pattern and the active pattern;
   an upper dopant region disposed at an upper portion of the active pattern and having a lower surface at a level higher than a top surface of the upper selection gate pattern;
   a lower dopant region disposed at a lower portion of the active pattern and having an upper surface located at a level lower than a bottom surface of the lower selection gate pattern; and
   a semiconductor region that is more lightly doped than the lower dopant region and is on the lower dopant region, the semiconductor region comprising a bottom surface that is below the bottom surface of the lower selection gate pattern.

2. The nonvolatile memory device of claim 1, further comprising a bit line electrically connected to the upper dopant region,
   wherein the bit line comprises a first substance different from that of the upper dopant region.

3. The nonvolatile memory device of claim 2, further comprising a contact plug between the upper dopant region and the bit line,
   wherein the contact plug comprises a second substance different from that of the upper dopant region.

4. The nonvolatile memory device of claim 3, further comprising an ohmic layer between the upper dopant region and the contact plug.

5. The nonvolatile memory device of claim 1, wherein when an operational voltage is applied to the upper selection gate pattern and the lower selection gate pattern, an inversion layer is formed on a sidewall of the active pattern between the upper dopant region and the upper selection gate pattern and a sidewall of the active pattern between the lower dopant region and the lower selection gate pattern.

6. The nonvolatile memory device of claim 1, wherein:
   the active pattern comprises a first semiconductor pattern, a second semiconductor pattern, and a third semiconductor pattern, which are sequentially stacked,
   the lower dopant region is formed at least in the first semiconductor pattern, and
   the upper dopant region is formed at least in the third semiconductor pattern.

7. The nonvolatile memory device of claim 6, wherein a boundary surface exists between the first semiconductor pattern and the second semiconductor pattern and between the second semiconductor pattern and the third semiconductor pattern.

8. The nonvolatile memory device of claim 1, wherein a distance between the lower surface of the upper dopant region and the top surface of the upper selection gate pattern is longer than that between the upper surface of the lower dopant region and the bottom surface of the lower selection gate pattern.

9. The nonvolatile memory device of claim 1, further comprising:
   an upper insulating pattern disposed on the upper selection gate pattern; and
   a lower insulating pattern disposed between the lower selection gate pattern and the substrate,
   wherein the upper insulating pattern and the lower insulating pattern are thicker than the inter-gate insulating pattern.

10. The nonvolatile memory device of claim 1, wherein:
    a distance between the top surface of the upper selection gate pattern and the upper dopant region is shorter than or equal to that between adjacent cell gate patterns, and
    a distance between the bottom surface of the lower selection gate pattern and the lower dopant region is shorter than or equal to that between adjacent cell gate patterns.

11. A vertical NAND string nonvolatile memory device comprising:

an upper dopant region disposed at an upper portion of an active pattern and having a lower surface located at a level higher than a top surface of an upper selection gate pattern;

a lower dopant region disposed at a lower portion of the active pattern and having an upper surface located at a level lower than a bottom surface of a lower selection gate pattern; and a semiconductor region that is more lightly doped than the lower dopant region and is on the lower dopant region, the semiconductor region comprising a bottom surface that is below the bottom surface of the lower selection gate pattern.

12. A vertical NAND string nonvolatile memory device of claim 11, wherein the semiconductor region is between the upper portion and the lower portion.

13. A vertical NAND string nonvolatile memory device of claim 11, wherein the lower surface of the upper dopant region faces a vertical channel of the device that is located above a top surface of an upper selection gate pattern by a first distance selected to increase a threshold voltage of a transistor comprising the upper dopant region and the upper selection gate pattern.

14. A vertical NAND string nonvolatile memory device of claim 13, wherein the upper surface of the lower dopant region faces the vertical channel located beneath a bottom surface of a lower selection gate pattern by a second distance selected to increase a threshold voltage of a transistor comprising the lower dopant region and the lower selection gate pattern.

15. A nonvolatile memory device comprising:
gate patterns including a lower selection gate pattern, a plurality of cell gate patterns, and an upper selection gate pattern, which are sequentially stacked on a substrate;

an active pattern penetrated into the gate patterns, the active pattern comprising a lower dopant region, a semiconductor region, and an upper dopant region; and a data storage pattern between the gate patterns and the active pattern, wherein the upper dopant region has a lower surface at a level higher than a top surface of the upper selection gate pattern, wherein the lower dopant region has an upper surface located at a level lower than a bottom surface of the lower selection gate pattern, and wherein the semiconductor region is more lightly doped than the lower dopant region and is on the lower dopant region, and the semiconductor region has a bottom surface that is below the bottom surface of the lower selection gate pattern.

16. The nonvolatile memory device of claim 15, wherein a distance between the lower surface of the upper dopant region and the top surface of the upper selection gate pattern is longer than that between the upper surface of the lower dopant region and the bottom surface of the lower selection gate pattern.

17. The nonvolatile memory device of claim 15, wherein:
a distance between the top surface of the upper selection gate pattern and the upper dopant region is shorter than or equal to that between adjacent cell gate patterns, and a distance between the bottom surface of the lower selection gate pattern and the lower dopant region is shorter than or equal to that between adjacent cell gate patterns.

18. The nonvolatile memory device of claim 15, further comprising:
an upper insulating pattern disposed on the upper selection gate pattern; and a lower insulating pattern disposed between the lower selection gate pattern and the substrate.

19. The nonvolatile memory device of claim 18, further comprising:
an inter-gate insulating pattern between the gate patterns.

20. The nonvolatile memory device of claim 19, wherein the upper insulating pattern and the lower insulating pattern are thicker than the inter-gate insulating pattern.

* * * * *